(12) United States Patent
Pratel et al.

(10) Patent No.: US 7,502,237 B2
(45) Date of Patent: Mar. 10, 2009

(54) POWER WAVEFORM HARMONIC ANALYSIS USING SUMMED SAMPLES

(75) Inventors: Pratik Shirish Pratel, Raleigh, NC (US); Frederick Tassitino, Wake Forest, NC (US)

(73) Assignee: Eaton Corporation, Cleveland, OH (US)

( * ) Notice: Subject to any disclaimer, the term of this patent is extended or adjusted under 35 U.S.C. 154(b) by 223 days.

(21) Appl. No.: 11/682,915

(22) Filed: Mar. 7, 2007

(65) Prior Publication Data
US 2008/0218153 A1    Sep. 11, 2008

(51) Int. Cl.
*H02J 1/02* (2006.01)
(52) U.S. Cl. ...................................................... 363/39
(58) Field of Classification Search ................... 363/39, 363/40, 43–48
See application file for complete search history.

(56) References Cited

U.S. PATENT DOCUMENTS

| | | | | |
|---|---|---|---|---|
| 5,594,630 A | * | 1/1997 | Baker | 363/40 |
| 6,414,859 B1 | * | 7/2002 | Zhang | 363/44 |
| 6,665,198 B2 | * | 12/2003 | Tasi et al. | 363/39 |
| 7,084,742 B2 | * | 8/2006 | Haines | 340/310.12 |

* cited by examiner

*Primary Examiner*—Matthew V Nguyen
(74) *Attorney, Agent, or Firm*—Myers Bigel Sibley & Sajovec

(57) ABSTRACT

Provided are methods and apparatus for characterizing a power waveform. Some such methods include sampling the power waveform to generate a plurality of samples and, for each of the samples, recursively processing the sample to generate an aggregate signal energy value, processing the sample to generate a harmonic component signal energy value associated with at least one target harmonic frequency, and accumulating the aggregate signal energy value and the component signal energy value with previously generated aggregate signal energy values and component signal energy values to generate an accumulated aggregate signal energy value and an accumulated harmonic component signal energy value. Methods also include characterizing the power waveform responsive to the accumulated aggregate signal energy value and the accumulated harmonic component signal energy value.

20 Claims, 6 Drawing Sheets

POWER WAVEFORM HARMONIC ANALYSIS USING SUMMED SAMPLES

BACKGROUND OF THE INVENTION

The present invention relates to electronic devices, and more particularly, to determining power quality characteristics in a power system.

Harmonic currents at frequencies other than the fundamental frequency of a power waveform can result in suboptimal performance of power system components. For example, a third harmonic current having significant energy can result in excess heating of transformers. By determining the harmonic content of a power waveform, undesirable harmonics can be filtered out and/or otherwise accommodated for in a power system.

In some instances, the total harmonic content can be determined as the total harmonic distortion (THD) of a waveform. The THD can be computed using a Discrete Fourier Transform (DFT) or a Fast Fourier Transform (FFT). When computing a THD of a waveform, the waveform may be sampled periodically N times. When computing a DFT, $2N^2$ calculations may be required. Similarly, the FFT may require 2N log N calculations. Storing the results of such calculations may require substantial storage resources, such as for example, large blocks of memory.

Typically, the output of a DFT consists of bins that include magnitude and phase data for different frequencies. In order to compute THD from, for example, a DFT, an additional complex calculation on the array of the frequency domain data is typically performed. Selection of optimal sampling parameters in bandwidth processing gain and spectral leakage in consecutive bins can be computed using Nyquist criteria. For example, in the case of a sixty Hertz waveform, as frequently utilized in power applications, a desirable number of computed samples may be 2048. Thus, the number of calculations for computing a power waveform property may require significant memory and processing resources. A more efficient technique for performing harmonic analysis of a power waveform is desired.

SUMMARY OF THE INVENTION

Some embodiments of the invention include methods and apparatus for characterizing a power waveform. In some embodiments, methods include sampling the power waveform to generate a plurality of samples and, for each sample, recursively processing the sample to generate an aggregate signal energy value, processing the sample to generate a harmonic component signal energy value associated with at least one target harmonic frequency, and accumulating the aggregate signal energy value and the harmonic component signal energy value with previously generated aggregate signal energy values and harmonic component signal energy values to generate an accumulated aggregate signal energy value and an accumulated harmonic component signal energy value. Such methods may also include characterizing the power waveform responsive to the accumulated aggregate signal energy value and the accumulated harmonic component signal energy value.

In some embodiments, processing the samples to generate harmonic component signal energy values associated with the at least one target harmonic component may include performing bin-limited Discrete Fourier Transform (DFT) computations for the plurality of samples.

Some embodiments may include estimating a cycle timing of the power waveform, wherein sampling the power waveform to generate a plurality of samples may include adjusting a sample period for the sampling of the power responsive to the estimated timing.

In some embodiments, estimating a cycle timing of the power waveform includes estimating a period of a first harmonic of the power waveform and adjusting a sample period for the sampling of the power responsive to the estimated timing includes adjusting the sample period to maintain a fixed number of sample periods within the estimated period of the first harmonic.

In further embodiments, processing the sample to generate an aggregate signal energy value includes computing a squared value of the sample and processing the sample to generate a harmonic component signal energy value associated with at least one target harmonic component includes computing real and imaginary values for the at least one target harmonic frequency. In some embodiments, respectively accumulating the aggregate signal energy values and the harmonic component signal energy values to recursively generate an accumulated aggregate signal energy value and an accumulated harmonic component signal energy value includes accumulating the squared values to generate the accumulated aggregate signal energy value and accumulating the respective real and imaginary values to generate respective accumulated real and imaginary values.

Some embodiments may also include generating a target harmonic peak energy value by dividing the square root of the sum of the accumulated real values squared and the accumulated imaginary values squared by a quantity of samples.

In other embodiments, generating the aggregate signal energy value includes computing a squared value of each sample and accumulating the aggregate signal energy value includes adding each aggregate signal energy value to a sum of previously generated aggregate signal energy values.

In some embodiments, a quantity of sample values accumulated in a sample set is constant.

In some embodiments, generating the harmonic component signal energy value includes multiplying the each of the plurality of samples with a cosine of a value that is responsive to the at least one target harmonic component and accumulating the component signal energy value includes adding the component signal energy value to previously generated component signal energy values.

In some embodiments, characterizing the power waveform includes generating a total harmonic distortion percent as a first value divided by a second value, wherein the first value includes a square root of a sum of the accumulated aggregate signal energy value and a square of the accumulated harmonic component signal energy, and the second value includes the accumulated harmonic component signal energy.

In some embodiments of the invention, an electrical power apparatus may include a sample generator circuit configured to generate samples of a power waveform signal. Embodiments may also include a signal energy determiner circuit configured to recursively: determine an aggregate signal energy value; to determine a harmonic real signal energy value associated with at least one target harmonic frequency and a harmonic imaginary signal energy value associated with the at least one target harmonic frequency; to accumulate the aggregate signal energy value with a sum of previously generated aggregate signal energy values; and to accumulate the harmonic component signal energy value with a sum of previously generated harmonic component signal energy values. The apparatus of some embodiments may further include a power waveform characterizer configured to characterize the power waveform responsive to the accumulated aggregate signal energy value and the accumulated harmonic component signal energy value.

In some embodiments, sample generator circuit comprises an analog-to-digital converter configured to generate a fixed quantity of sample values per sample set.

Some embodiments may also include a power waveform cycle timing estimator configured to estimate a period of a first harmonic of the power waveform and a sampling period regulator configured to adjust a sampling period responsive to the estimated cycle timing to maintain a fixed quantity of sample periods within the estimated period of the first harmonic, wherein a quantity of first harmonic periods in a sample set comprises an integer value.

In some embodiments, the power waveform characterizer is configured to calculate percent total harmonic distortion and the aggregate signal energy values comprise a square of each of the samples.

In some embodiments, the harmonic real signal energy values include a cosine function of each of the plurality of sample values and the harmonic imaginary signal energy values comprise a sine function of each of the plurality of sample values.

Some embodiments may include an alert generator configured to generate an alert signal when a power waveform property value determined by the characterizing logic traverses a threshold value.

In some embodiments, the electrical power apparatus includes a power distribution apparatus and wherein the power waveform is characterized for each of a plurality of power distribution outputs.

In some embodiments, the power waveform characterizer is configured to calculate a fundamental energy of the input signal corresponding to the energy of the input signal at a first harmonic frequency and a total energy of the input signal corresponding to the total energy of the input signal.

In further embodiments, the power waveform characterizer is further configured to calculate a percent total harmonic distortion responsive to the fundamental energy and the total energy.

In some embodiments, methods may include synchronizing a sampling frequency to an integer factor of a first harmonic frequency and sampling, at the sampling frequency, the power waveform to receive a fixed quantity of a plurality of sample values. Such methods may also include summing selected harmonic components of the plurality of sample values, summing aggregate signal energy values of the plurality of sample values, and calculating total harmonic distortion responsive to the sums of the selected harmonic components and sums of the aggregate signal energy values.

DETAILED DESCRIPTION OF EXEMPLARY EMBODIMENTS

Specific exemplary embodiments of the invention now will be described with reference to the accompanying drawings. This invention may, however, be embodied in many different forms and should not be construed as limited to the embodiments set forth herein; rather, these embodiments are provided so that this disclosure will be thorough and complete, and will fully convey the scope of the invention to those skilled in the art. It will be understood that when an element is referred to as being "connected" or "coupled" to another element, it can be directly connected or coupled to the other element or intervening elements may be present. As used herein the term "and/or" includes any and all combinations of one or more of the associated listed items. Like numbers refer to like elements throughout.

Figure 1:
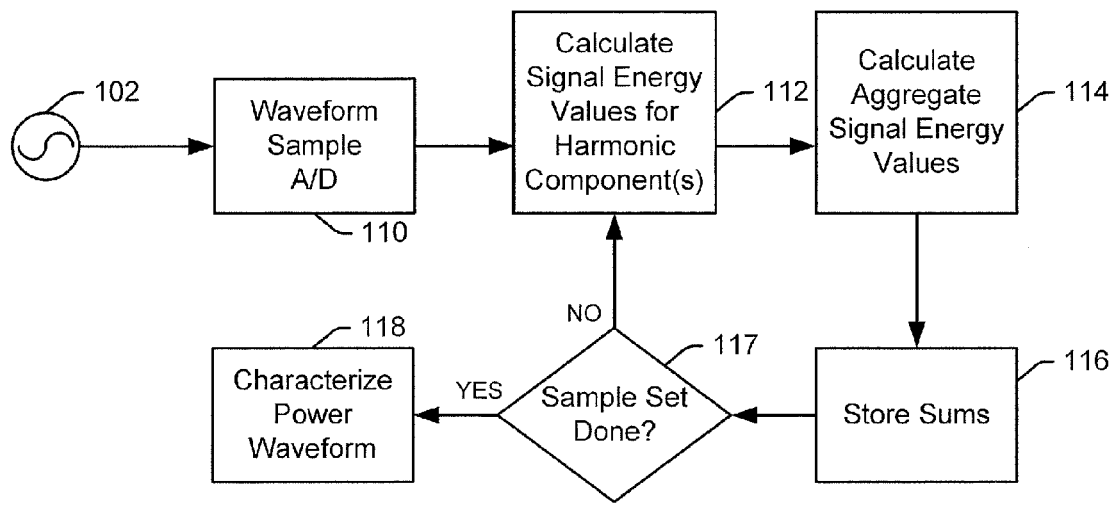
FIG. 1 is a block diagram illustrating operations for characterizing a power waveform according various embodiments of the invention.

Reference is now made to FIG. 1, which is a block diagram illustrating operations for characterizing a power waveform according to various embodiments of the invention. An alternating current (AC) power waveform signal 102 is sampled using, for example, an analog-to-digital converter (block 110). The power waveform signal may correspond to phase voltages and/or currents in a single and/or multiple-phase electrical power system. For each of the samples, signal energy values corresponding to harmonic component signal energy values are calculated (block 112). In some embodiments, the harmonic component signal energy values are harmonic component signal energy values associated with, for example, a target harmonic frequency. In some embodiments, the target harmonic frequency may correspond to the first harmonic (fundamental) frequency in a power waveform. In some embodiments generating the harmonic component signal energy values includes performing bin-limited Discrete Fourier Transform (DFT) computations for the samples. By limiting the bins, the harmonic components may be limited to those frequencies corresponding to the selected bin(s). Calculating the harmonic component signal energy values may include computing real and imaginary signal energy values at a target harmonic frequency for each of the samples.

An aggregate signal energy value is calculated for each of the samples (block 114). In some embodiments, the aggregate signal energy value is computed by squaring the value of the sample. Sums of each of the calculated harmonic component signal energy values and the calculated aggregate energy values are stored in respective memory locations (block 116). For example, the calculated values of each of the respective components is added to the sum of the previously calculated values such that a single memory address could be utilized for each of the calculated values. The power waveform is characterized using the accumulated aggregate signal energy value and the accumulated harmonic components (block 118). In this manner, the recursive calculations may be utilized to determine harmonic component values and aggregate signal energy values and to store respective sums of the respective values, which may subsequently be used to characterize the power waveform. Although illustrated as different operations, in some embodiments the operations of blocks 112, 114, 116, and/or 117 may be combined and performed by a fewer than four components and/or devices. For example, the operations of blocks 112, 114, 116, and 117 may be performed within a single processing device.

Figure 2:
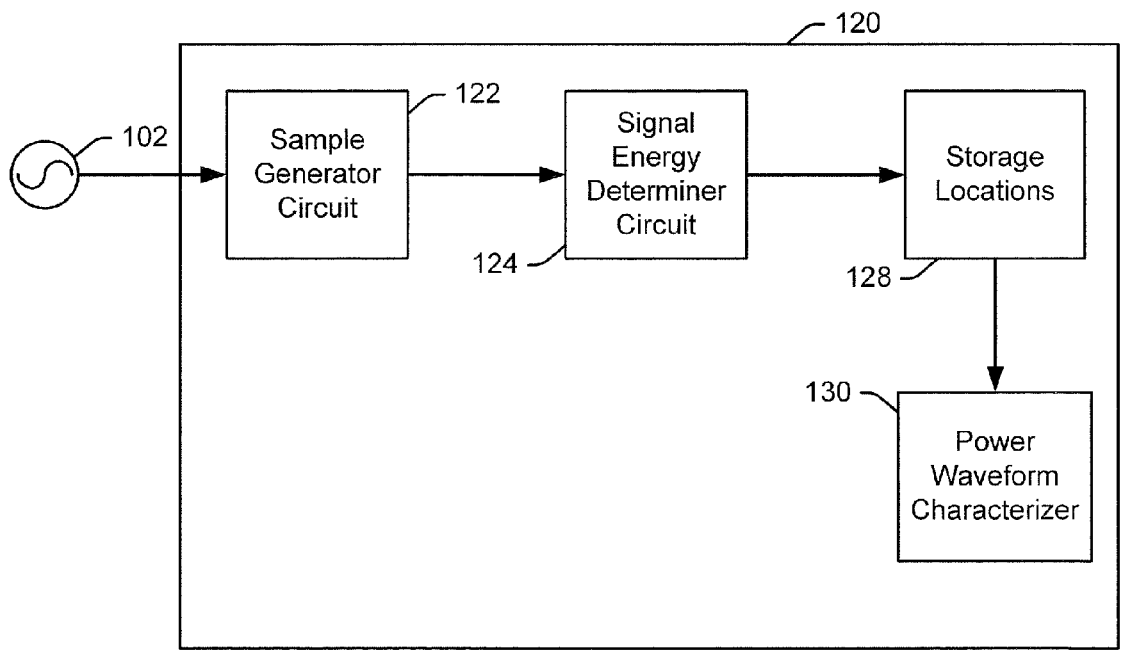
FIG. 2 is a block diagram illustrating an electrical power apparatus according to some embodiments of the invention.

Reference is now made to FIG. 2, which is a block diagram illustrating an electrical power apparatus according to some embodiments of the invention. The apparatus 120 includes a sample generator circuit 122 configured to receive a power waveform signal 102 and to generate multiple samples of the power waveform signal 102. The apparatus 120 also includes a signal energy determiner circuit 124 that is configured to calculate, for each of the samples, a harmonic real signal energy value associated with a target harmonic frequency and a harmonic imaginary signal energy value associated with the target harmonic frequency. In some embodiments, the harmonic real signal energy value may be determined by multiplying the sample value with a cosine function of the sample number and a target harmonic frequency-specific constant. Similarly, a harmonic imaginary signal energy value may be determined by multiplying a sample value with a sine function of a sample number and the target harmonic frequency specific constant. In some embodiments, the value of the target harmonic frequency-specific constant may also be a function of the quantity of samples in the sample set. The signal energy determiner circuit 124 may also be configured to calculate an aggregate signal energy value for each of the samples. In some embodiments, the aggregate signal energy may be determined as the square of the sample value.

Storage locations 128 may be provided for accumulating and storing the harmonic real signal energy value, the harmonic imaginary signal energy value and the aggregate signal energy value calculated for each sample. In this manner, after the samples in a given sample set have been received, storage locations store each of the sum of the harmonic real signal energy values, the sum of harmonic imaginary signal energy values and the sum of the aggregate signal energy values. The three accumulated values can then be used by a power waveform characterizer 130 to characterize the power waveform. In some embodiments, the power waveform characterizer 130 can be configured to calculate a percent total harmonic distortion, for example. Since the THD represents energy at frequencies other than the target harmonic frequency, the THD can be determined as the percent difference between the total signal energy and the signal energy at the target harmonic frequency. In some embodiments, the target harmonic frequency value can be adjusted to specifically identify harmonic energy at specific frequencies.

Figure 3:
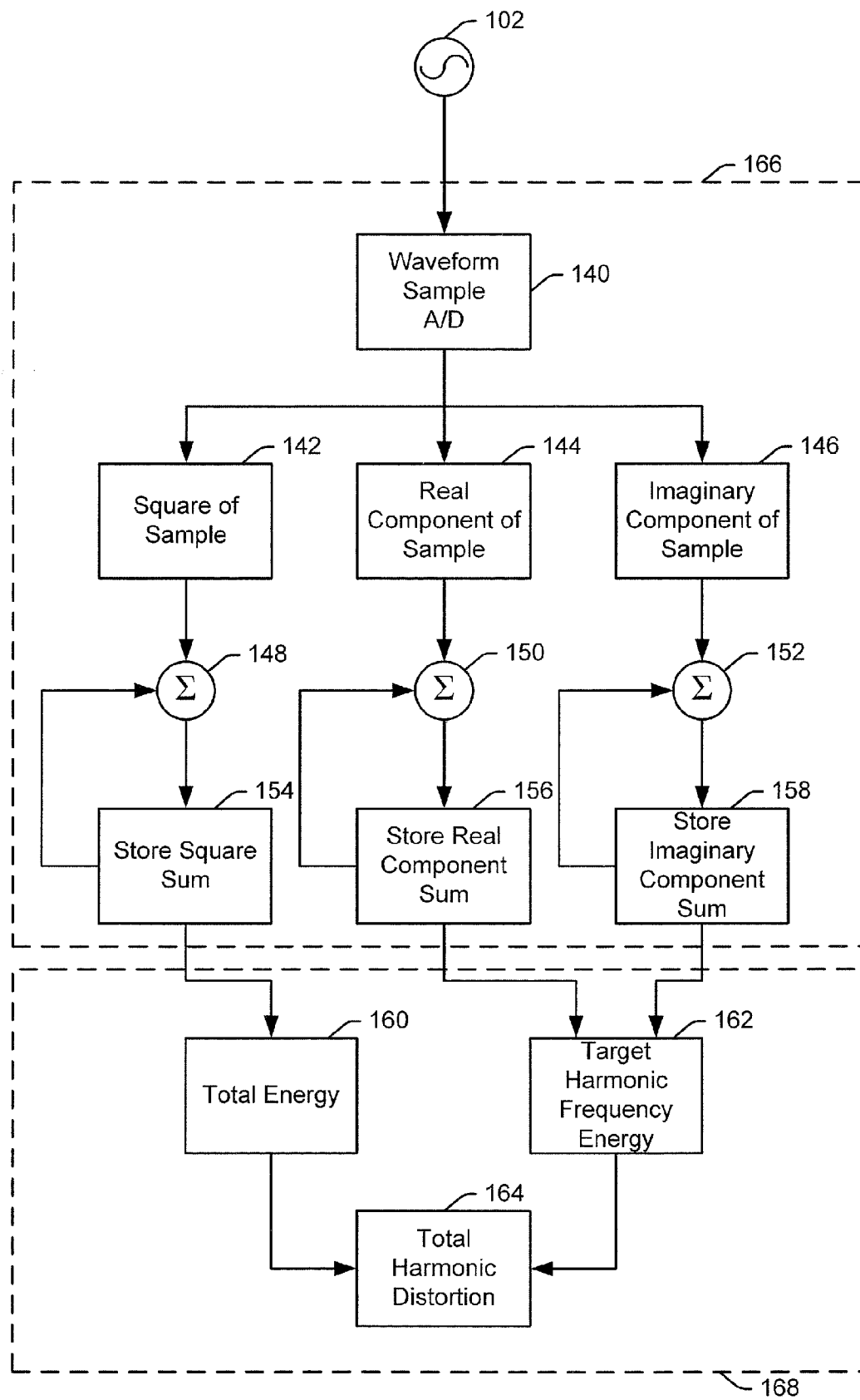
FIG. 3 is a block diagram illustrating functional blocks of apparatus/methods according to some embodiments of the invention.

Reference is now made to FIG. 3, which is a block diagram illustrating functional blocks of apparatus/methods according to some embodiments of the invention. As illustrated, the functions according to some embodiments herein may be generally characterized in two classes based on the frequency with which they are performed. The classes of functions include those that are performed at each sample interval (block 166) and those that are performed after all samples in a sample set are processed (block 168). Referring first to the per-sample operations, the power waveform signal 102 is received and samples are generated (block 140). The samples may be generated by, for example, an analog-to-digital (A/D) converter.

An aggregate signal energy value corresponding to each sample is determined by squaring the value of each sample (block 142). Each squared sample value is added (block 148) with the sum of the previously calculated squared sample values. The sum of the squared sample values is stored (block 154) in, for example, a memory address. In this manner, a signal memory address can be used to accumulate the sum of the squared sample values for an entire sample set.

Real and imaginary components corresponding to a target harmonic frequency are also calculated for each sample (blocks 144, 146). Each of the real components and the imaginary components are added to the sum of previously calculated real and imaginary components, respectively (blocks 150, 152). The respective sums of the real and imaginary components are stored in storage locations (blocks 156, 158). In this manner, at the end of the sample set, a memory address will include the sum of the real components corresponding to a target harmonic frequency and another memory address will include the sum of the imaginary components corresponding to a target harmonic frequency for all of the samples in the sample set.

After all the samples are generated and processed and the sums of the squares, real components and imaginary components are stored, the per sample set operations can be performed. A total energy value of the power waveform may be determined by taking the square root of the sum of the squares of the samples (block 160). The total energy value represents the total energy of a signal at all of the frequencies. A target harmonic energy value is calculated responsive to the sum of the real components and the sum of the imaginary components (block 162). In some embodiments, the target harmonic frequency energy may be determined by the following equation where "N" is the quantity of samples in the sample set:

$$TrgetHarmonicEnergy = \frac{\sqrt{\text{Sum } Real^2 + \text{Sum } Imaginary^2}}{N\sqrt{2}}$$

In some embodiments, the target harmonic frequency represents the intended component of a power waveform such that any additional energy at other harmonic frequencies may generally be undesirable. For example, a power waveform may have a first harmonic frequency around 60 Hz. Signal energy corresponding to all other harmonic frequencies, such as the third, fifth, seventh, and ninth harmonics, etc. may be collectively considered as total harmonic distortion. The percent total harmonic distortion may be determined using the percent energy difference between the total energy of the power waveform and the target harmonic frequency energy of the power waveform using, for example, the following equation (block 164):

$$\% THD = \frac{\sqrt{TotalRMS^2 - TrgetHarmonicEnergy^2}}{TrgetHarmonicEnergy} \times 100.$$

Figure 4:
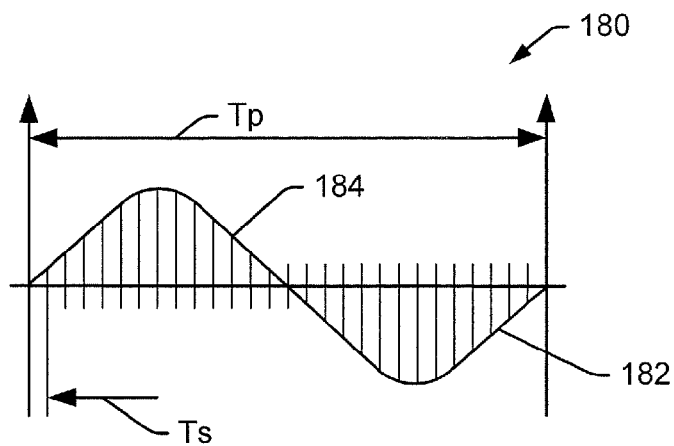
FIG. 4 is a graph illustrating sampling frequency of a power waveform according to various embodiments of the invention.

Reference is now made to FIG. 4, which is a graph illustrating sampling frequency of a power waveform according to various embodiments of the invention. The graph illustrates a single cycle of a power waveform 182 that may have an approximate first harmonic frequency of, for example, 60 Hz and a cycle period of $T_p$. The graph 180 also illustrates samples 184 taken at every intervals $T_s$. Although the graph illustrates starting the sampling at a zero crossing of the power waveform 184, the samples can begin at any point during the waveform, but are preferably configured to include an integer number of power waveforms 184 within the sample set. In this manner, the sampling frequency should be an integer multiple of the fundamental waveform frequency in order to remove any detrimental affects of spectral leakage in consecutive DFT bins.

While the frequency of the power waveform may be assumed approximately, in reality, power waveforms may actually vary within some frequency range around the approximate value. For example, in a generally 60 Hz power waveform, the actual power waveform may be delivered at 59.9 Hz or 60.1 Hz instead of 60 Hz. For this reason, it may be desirable to regulate the sample frequency or the sample period $T_s$ to maintain the integer relationship between the sampling period $T_s$ and the power waveform period $T_p$. By adjusting $T_s$ responsive to the value of $T_p$, the spectral leakage associated with data of only a partial cycle of the power waveform may be avoided.

Figure 5:
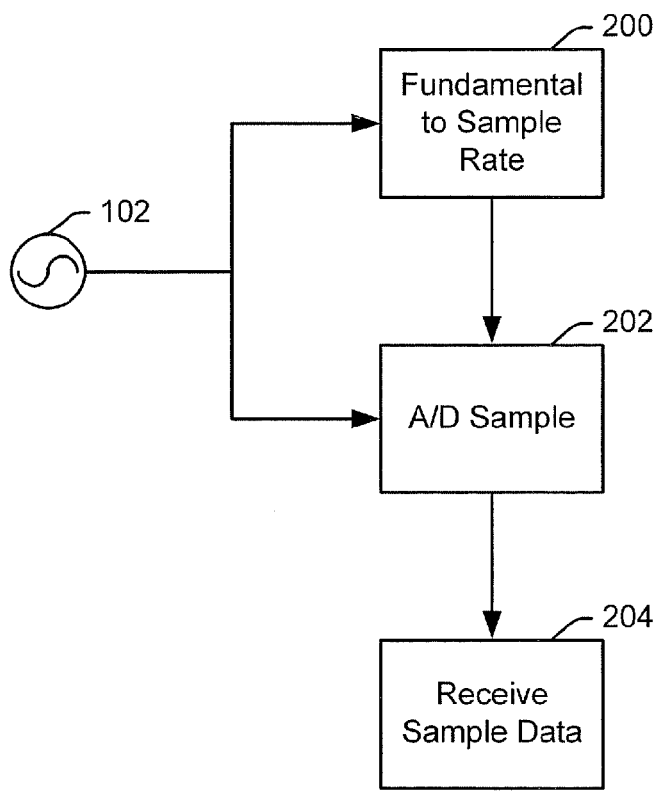
FIG. 5 is a block diagram illustrating operations for adjusting the sampling period in apparatus/methods according to some embodiments of the invention.

Reference is now made to FIG. 5, which is a block diagram operations for adjusting the sampling period in apparatus/methods according to some embodiments of the invention. As discussed above regarding FIG. 4, it may be desirable to adjust the sample frequency/period as a function of the actual and/or estimated fundamental or first harmonic frequency of the power waveform. In this manner, a power waveform signal 102 is utilized by a fundamental to sample rate operation 200 to provide the sample rate (sample period). The sample rate may be provided by estimating the actual first harmonic frequency of the power waveform and multiplying that frequency value by an integer value. The analog to digital sample operation 202 can utilize the adjusted sample rate to insure that the sample data received (block 204) corresponds to an integer number of power waveform cycles. In this manner, spectral leakage corresponding to a sample set that includes data from a fractional power waveform cycle may be avoided.

Figure 6:
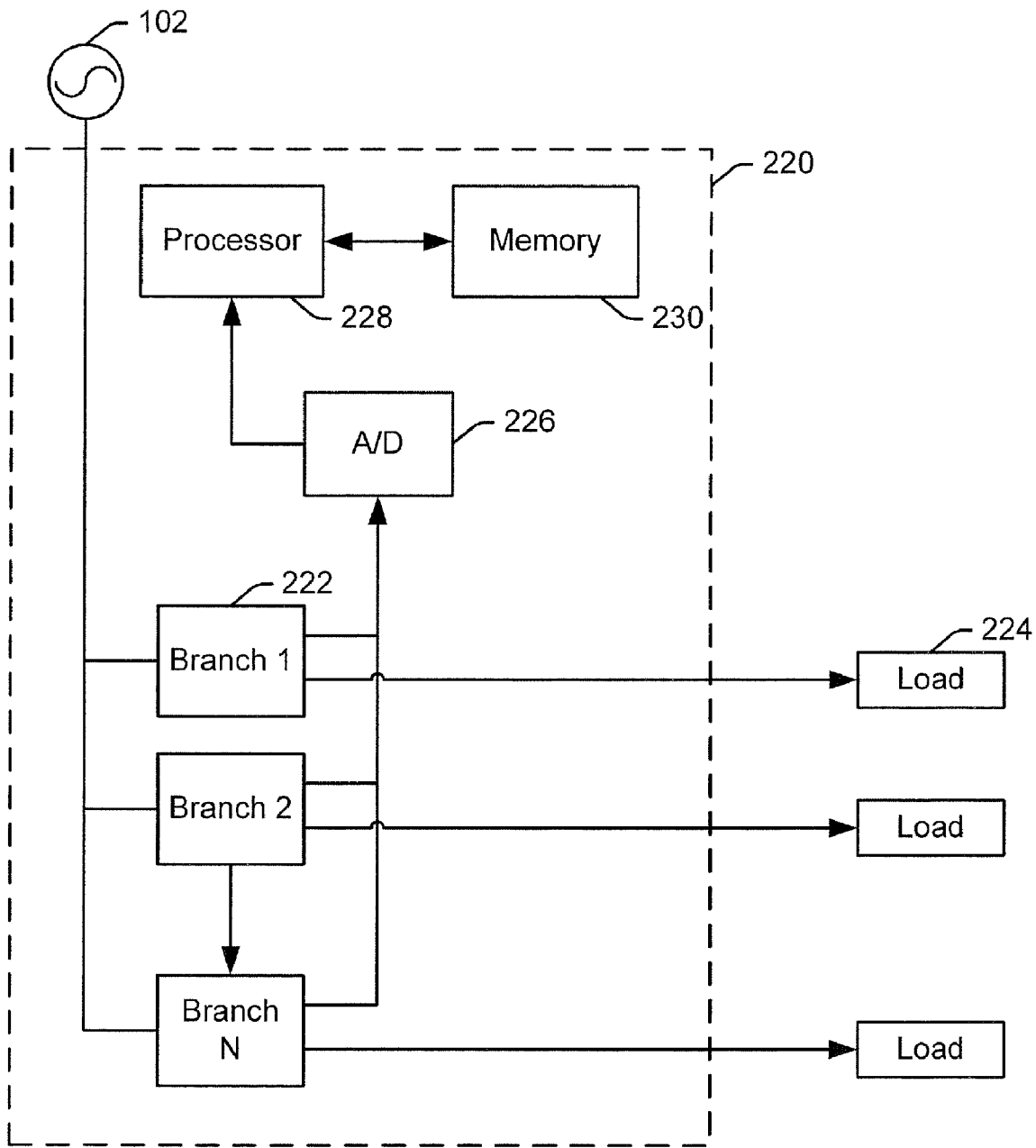
FIG. 6 is a block diagram illustrating a distributed load panel utilizing apparatus/methods for characterizing a power waveform according to various embodiments of the invention.

Reference is now made to FIG. 6, which is a block diagram illustrating a distributed load panel utilizing apparatus/methods for characterizing a power waveform according to various embodiments of the invention. A distributed load panel 220 may be configured to receive a power waveform 102 to supply power to multiple branch circuits 222. In some embodiments, each branch circuit 222 may be isolated from the power waveform 102 by one or more power conversion and/or modification devices (not shown), such as, for example, transformers. Each branch circuit 222 may be configured to provide power to a different load 224, each of which may include different power consumption characteristics and/or properties.

The different power consumption characteristics and/or properties may result in different harmonic content in the power waveforms of the different branch circuits 222. In this manner, an analog-to-digital (A/D) converter 226 may be configured to generate samples of the power waveforms corresponding to each branch 222. In some embodiments, this may be accomplished by using multiple A/D converters 226 and/or A/D converters having multiple input channels. In some embodiments, power waveform signals may be multiplexed into a single A/D converter 226.

A processor 228 may be configured to receive and process the samples using, for example, per-sample recursive calculations to generate and store sums of harmonic real components, harmonic imaginary components, and aggregate signal energy values in memory 230. After the samples of a sample set have been processed, the processor 228 may be configured to characterize the power waveform of each of the branch circuits 222 using the values stored in the memory 230. In some embodiments, the processor 228 may be configured to calculate percent total harmonic distortion of each branch circuit 222 and/or for the power waveform received into the distributed load panel 220.

It will be understood that FIG. 6 represents an exemplary embodiment of the present invention and that the present invention may be implemented in other types of power apparatus. For example, the invention could be in a power meter and/or a UPS. In some embodiments, a power meter and/or UPS could use the bifurcated processing scheme of FIG. 3.

Figure 7:
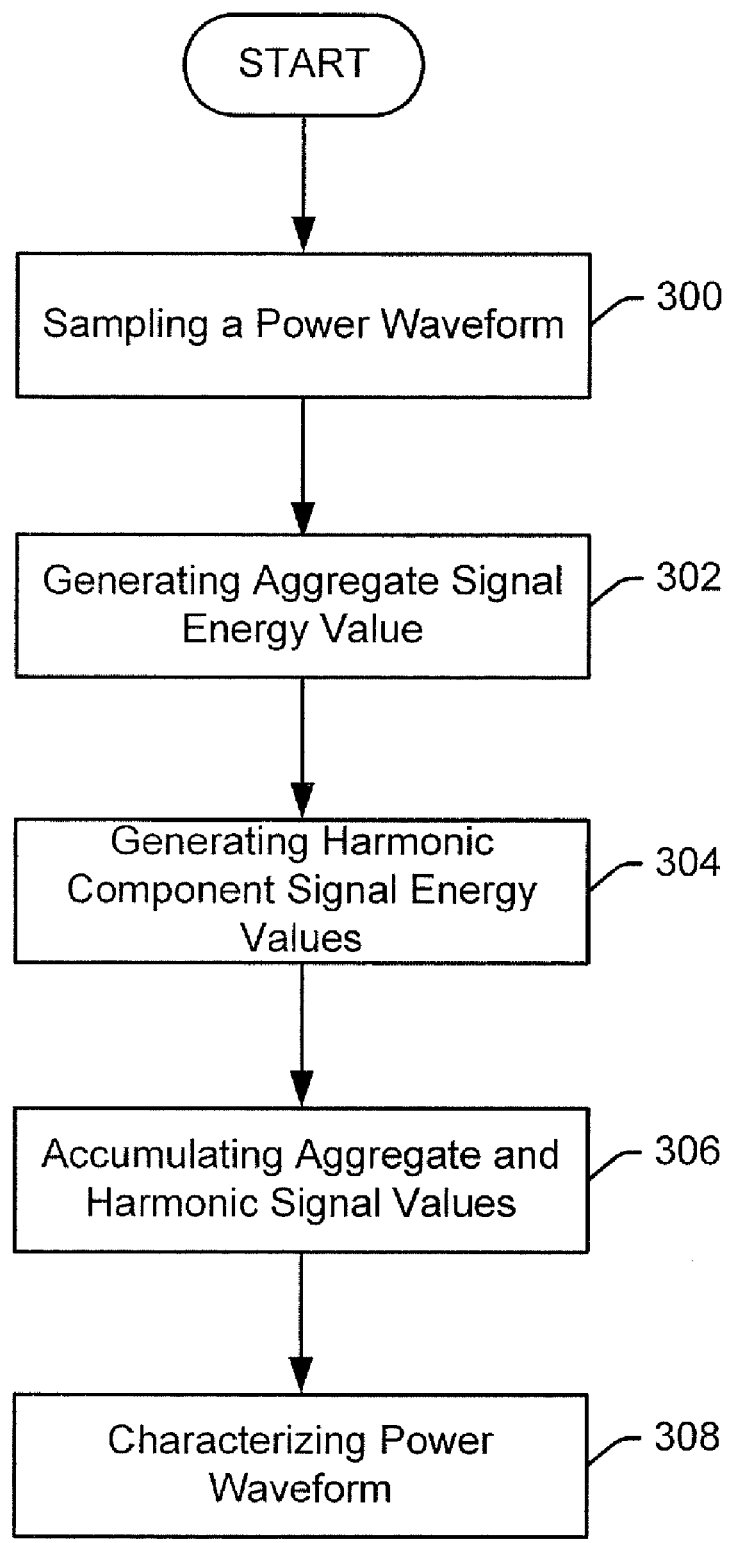
FIG. 7 is a block diagram illustrating operations according to various embodiments of the invention.

Reference is now made to FIG. 7, which is a block diagram illustrating operations according to various embodiments of the invention. A power waveform is sampled to generate, for example, a predetermined number of samples in a sample set that corresponds to one or more cycles of the power waveform (block 300). In some embodiments, the cycle timing of the power waveform is estimated and a sample period for the samples in the sample set is adjusted responsive to the estimated timing. This may be beneficial in avoiding spectral leakage that may occur when the sample set includes data corresponding to a fractional portion of a cycle of the power waveform.

An aggregate signal energy value corresponding to the energy value of the full spectrum of the power waveform signal is generated for each sample (block 302). In some embodiments, the aggregate signal energy value may be determined for each sample by squaring the value of the sample. Each sample may also be used to generate a harmonic component signal energy value corresponding to a target harmonic frequency (block 304). In some embodiments, the harmonic component signal energy value may be generated as a harmonic real signal energy value and a harmonic imaginary signal energy value. For example, harmonic real signal energy value may be generated by the equation:

$$\text{Real} = x(n) * \cos(a*n);$$

where "n" is the number of the sample, "x(n)" is the sample value of the nth sample, and "a" is a constant that is a function of the target harmonic frequency and the total number of samples in the sample set. In some embodiments, "a" may be determined by the equation:

$$a = (2\pi m)/N;$$

where m is the bin number corresponding to a bin-specific DFT around sixty Hz and N is the total number of samples in the sample set. Similarly, the harmonic imaginary signal energy value may be determined by the equation:

$$\text{Imaginary} = x(n) * \text{Sin}(a*n);$$

In this manner, real and imaginary harmonic signal energy values may be determined for each sample.

The aggregate signal energy values and the harmonic component signal energy values are accumulated in respective storage locations (block 306). Accumulating reduces the need for significant memory resources by storing, in, for example, memory locations, the sums of the values for each of the aggregate signal energy values and the harmonic component signal energy values. In this manner, the sum of the aggregate signal energy value is determined as the aggregate signal energy value of a new sample added to the sum of the previously calculated aggregate signal energy values. Similarly, the sum of the harmonic real signal energy values for the samples in the sample set may be accumulated in a memory address and the sum of the harmonic imaginary signal energy values for the samples in the sample set may be accumulated in yet another memory address.

Using the accumulated values stored in the storage locations, the power waveform may be characterized (block 308). For example, in some embodiments a peak value of the power waveform associated with the target harmonic frequency may be determined using the equation:

$$Peak = \frac{\sqrt{Sum\ Real^2 + Sum\ Imaginary^2}}{N};$$

where SumReal and SumImaginary are the sums of the harmonic real and imaginary signal energy values and N is the number of samples in the sample set. The energy of the power waveform at the target harmonic frequency can then be determined by the equation:

$$TrgetHarmonicEnergy = \frac{Peak}{\sqrt{2}}.$$

In addition to calculating the harmonic energy at the target harmonic frequency, the total energy of the power waveform, which corresponds to the Root Mean Squared (RMS) value of the power waveform, may be calculated as the square root of the sum of the aggregate signal energy values. Using the total energy of the power waveform and the target harmonic energy, which represents the energy of the power waveform at, for example, the first harmonic or fundamental frequency, the percent of the total energy at frequencies other than the target harmonic frequency may be determined. The energy at frequencies other than the target harmonic frequency may be undesirable and characterized as distortion. In this manner, the percent total harmonic distortion (THD) may be determined using the following equation:

$$\%\ THD = \frac{\sqrt{TotalRMS^2 - TrgetHarmonicEnergy^2}}{TrgetHarmonicEnergy} \times 100$$

In this manner, the THD can be efficiently calculated using, for example, three memory locations and a basic processor.

Figure 8:
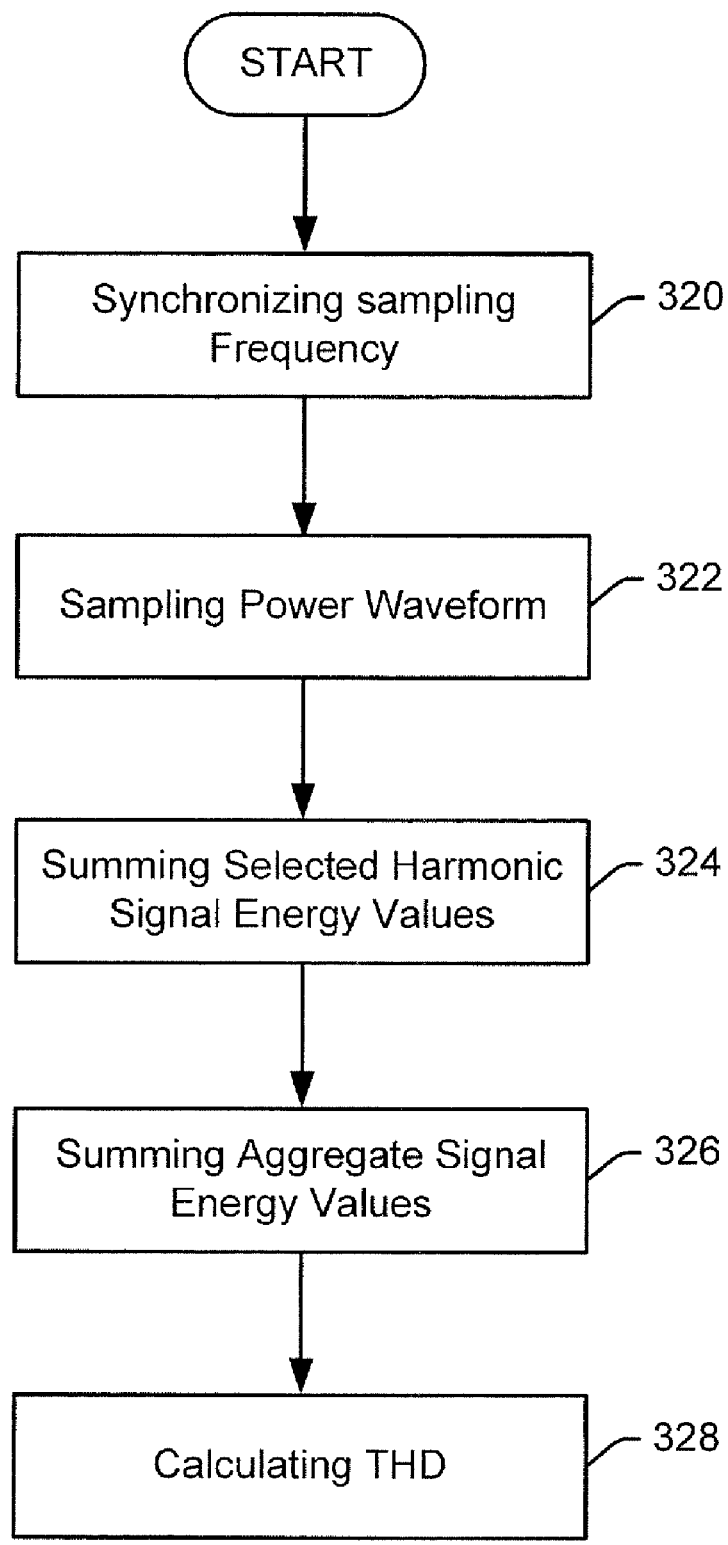
FIG. 8 is a block diagram illustrating operations according to various other embodiments of the invention.

Reference is now made to FIG. 8, which is a block diagram illustrating operations according to various other embodiments of the invention. A sampling frequency is synchronized to a power waveform (block 320). In some embodiments the synchronizing can include estimating the cycle time of a first harmonic of the power waveform and adjusting the sampling frequency to be an integer multiple of the estimated first harmonic frequency. In some embodiments, estimating the cycle time may be performed by detecting and/or measuring the cycle time. In some embodiments, a predefined quantity of samples are in a sample set. In such embodiments, the sample frequency may be determined such that an integer number of first harmonic cycles are sampled in the sample set. By not including data from fractional first harmonic cycles of the power waveform, the effects of spectral leakage, which may increase calculation errors, may be reduced.

The power waveform is sampled at the sampling rate as determined in the synchronizing step (block 322). Selected harmonic signal energy values calculated from each of the samples in the sample set are summed, respectively, and may be stored in memory (block 324). In some embodiments, the selected harmonic signal energy values include real and imaginary signal energy values of the samples at a target harmonic frequency, the sums of which may be stored in separate memory locations. In some embodiments, the target harmonic frequency may be the first harmonic of the power waveform, for example. Aggregate signal energy values calculated from each of the samples in the sample set are summed and may be stored in memory (block 326). The total harmonic distortion (THD) of the power waveform may be calculated using the summed values stored in memory (block 328).

In the drawings and specification, there have been disclosed exemplary embodiments of the invention. Although specific terms are employed, they are used in a generic and descriptive sense only and not for purposes of limitation, the scope of the invention being defined by the following claims.

That which is claimed:

1. A method of characterizing a power waveform, the method comprising:
   sampling the power waveform to generate a plurality of samples;
   recursively performing the following for each of the samples:
      processing the sample to generate an aggregate signal energy value;
      processing the sample to generate a harmonic component signal energy value associated with at least one target harmonic frequency; and
      accumulating the aggregate signal energy value and the harmonic component signal energy value with previously generated aggregate signal energy values and harmonic component signal energy values to generate an accumulated aggregate signal energy value and an accumulated harmonic component signal energy value; and wherein the method further comprises
   characterizing the power waveform responsive to the accumulated aggregate signal energy value and the accumulated harmonic component signal energy value.

2. The method of claim 1, wherein processing the samples to generate harmonic component signal energy values associated with at least one target harmonic component comprises performing bin-limited Discrete Fourier Transform (DFT) computations for the plurality of samples.

3. The method of claim 1, further comprising estimating a cycle timing of the power waveform and wherein sampling the power waveform to generate a plurality of samples comprises adjusting a sample period for the sampling of the power responsive to the estimated timing.

4. The method of claim 3:
   wherein estimating a cycle timing of the power waveform comprises estimating a period of a first harmonic of the power waveform; and
   wherein adjusting a sample period for the sampling of the power responsive to the estimated timing comprises adjusting the sample period to maintain a fixed number of sample periods within the estimated period of the first harmonic.

5. The method of claim 1:
   wherein processing the sample to generate an aggregate signal energy value comprises computing a squared value of the sample;
   wherein processing the sample to generate a harmonic component signal energy value associated with at least one target harmonic component comprises computing real and imaginary values for the at least one target harmonic frequency; and
   wherein respectively accumulating the aggregate signal energy values and the component signal energy values to recursively generate an accumulated aggregate signal energy value and an accumulated harmonic component signal energy value comprises:

accumulating the squared values to generate the accumulated aggregate signal energy value; and accumulating the respective real and imaginary values to generate respective accumulated real and imaginary values.

6. The method of claim 5, further comprising generating a target harmonic peak energy value by dividing the square root of the sum of the accumulated real values squared and the accumulated imaginary values squared by a quantity of samples.

7. The method of claim 1, wherein generating the aggregate signal energy value comprises computing a squared value of each sample and wherein the accumulating the aggregate signal energy value comprises adding each aggregate signal energy value to a sum of previously generated aggregate signal energy values.

8. The method of claim 1, wherein a quantity of sample values accumulated in a sample set is constant.

9. The method of claim 1, wherein generating the harmonic component signal energy value comprises multiplying the each of the plurality of samples with a cosine of a value that is responsive to the at least one target harmonic component and wherein accumulating the component signal energy value comprises adding the component signal energy value to previously generated component signal energy values.

10. The method of claim 1, wherein characterizing the power waveform comprises generating a total harmonic distortion percent as a first value divided by a second value, wherein the first value comprises a square root of a sum of the accumulated aggregate signal energy value and a square of the accumulated harmonic component signal energy, wherein the second value comprises the accumulated harmonic component signal energy.

11. An apparatus, comprising:
a sample generator circuit configured to generate samples of a power waveform signal;
a signal energy determiner circuit configured to recursively:
determine an aggregate signal energy value; to determine
a harmonic real signal energy value associated with at least one target harmonic frequency and a harmonic imaginary signal energy value associated with the at least one target harmonic frequency; to
accumulate the aggregate signal energy value with a sum of previously generated aggregate signal energy values; and to
accumulate the harmonic component signal energy value with a sum of previously generated harmonic component signal energy values; and
a power waveform characterizer configured to characterize the power waveform responsive to the accumulated aggregate signal energy value and the accumulated harmonic component signal energy value.

12. The apparatus of claim 11, wherein the sample generator circuit comprises an analog-to-digital converter configured to generate a fixed quantity of sample values per sample set.

13. The apparatus of claim 11, further comprising:
a power waveform cycle timing estimator configured to estimate a period of a first harmonic of the power waveform; and
a sampling period regulator configured to adjust a sampling period responsive to the estimated cycle timing to maintain a fixed quantity of sample periods within the estimated period of the first harmonic, wherein a quantity of first harmonic periods in a sample set comprises an integer value.

14. The apparatus of claim 11, wherein the power waveform characterizer is configured to calculate percent total harmonic distortion and the aggregate signal energy values comprise a square of each of the samples.

15. The apparatus of claim 11, wherein the harmonic real signal energy values comprise a cosine function of each of the plurality of sample values and the harmonic imaginary signal energy values comprise a sine function of each of the plurality of sample values.

16. The apparatus of claim 11, further comprising an alert generator configured to generate an alert signal when a power waveform property value determined by the characterizing logic traverses a threshold value.

17. The apparatus of claim 11, wherein the electrical power apparatus comprises a power distribution apparatus and wherein the power waveform is characterized for each of a plurality of power distribution outputs.

18. The apparatus of claim 11, wherein the power waveform characterizer is configured to calculate a fundamental energy of the input signal corresponding to the energy of the input signal at a first harmonic frequency and a total energy of the input signal corresponding to the total energy of the input signal.

19. The apparatus of claim 18, wherein the power waveform characterizer is further configured to calculate a percent total harmonic distortion responsive to the fundamental energy and the total energy.

20. A method of characterizing a power waveform, comprising:
synchronizing a sampling frequency to an integer factor of a first harmonic frequency;
sampling, at the sampling frequency, the power waveform to receive a fixed quantity of a plurality of sample values;
summing selected harmonic components of the plurality of sample values;
summing aggregate signal energy values of the plurality of sample values; and
calculating total harmonic distortion responsive to the sums of the selected harmonic components and sums of the aggregate signal energy values.

* * * * *

UNITED STATES PATENT AND TRADEMARK OFFICE
CERTIFICATE OF CORRECTION

PATENT NO.         : 7,502,237 B2
APPLICATION NO.    : 11/682915
DATED              : March 10, 2009
INVENTOR(S)        : Patel et al.

It is certified that error appears in the above-identified patent and that said Letters Patent is hereby corrected as shown below:

On Title Page:

Item 75, Inventors: Please correct "Pratik Shirish Pratel"
                    to read -- Pratik Shirish Patel --

Signed and Sealed this

Nineteenth Day of May, 2009

JOHN DOLL
*Acting Director of the United States Patent and Trademark Office*